United States Patent
Chen

(10) Patent No.: US 7,342,403 B2
(45) Date of Patent: Mar. 11, 2008

(54) TEST APPARATUSES FOR INTEGRATED CIRCUITS AND METHOD FOR MANUFACTURING THE SAME

(75) Inventor: Ga-Lane Chen, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 119 days.

(21) Appl. No.: 11/306,442

(22) Filed: Dec. 28, 2005

(65) Prior Publication Data

US 2006/0197547 A1 Sep. 7, 2006

(30) Foreign Application Priority Data

Jan. 22, 2005 (CN) .................. 2005 1 0032983

(51) Int. Cl.
*G01R 1/073* (2006.01)
*H01R 9/00* (2006.01)

(52) U.S. Cl. ........................ 324/762; 29/842

(58) Field of Classification Search .............. 117/68; 977/742; 324/762, 754
See application file for complete search history.

(56) References Cited

U.S. PATENT DOCUMENTS

| 6,668,628 | B2 * | 12/2003 | Hantschel et al. ............ 73/105 |
| 6,753,693 | B2 | 6/2004 | Seo et al. |
| 6,756,795 | B2 * | 6/2004 | Hunt et al. ................. 324/701 |
| 6,834,243 | B2 | 12/2004 | Zemer et al. |
| 2003/0010910 | A1 * | 1/2003 | Colbert et al. .............. 250/306 |
| 2003/0175462 | A1 * | 9/2003 | Nishino et al. .......... 428/36.91 |
| 2004/0106218 | A1 * | 6/2004 | Wang et al. ................. 438/15 |

* cited by examiner

*Primary Examiner*—Ernest Karlsen
(74) *Attorney, Agent, or Firm*—Winston Hsu

(57) ABSTRACT

A test apparatus for integrated circuits includes a data collector (1). The data collector includes a cantilever (10) and at least one probe (20). The probe is formed at a free end (18) of the cantilever and includes at least one carbon nanotube (22). A method for manufacturing the test apparatus for integrated circuits includes the steps of: (a) forming a substrate (12) at a free end of a cantilever; (b) forming at least one electrically conductive film (14) on the substrate; (c) depositing at least one catalyst film (16) on the corresponding electrically conductive film; and (d) depositing at least one carbon nanotube on each catalyst film thereby forming at least one probe thereat.

20 Claims, 3 Drawing Sheets

TEST APPARATUSES FOR INTEGRATED CIRCUITS AND METHOD FOR MANUFACTURING THE SAME

FIELD OF THE INVENTION

The invention relates generally to test apparatuses for integrated circuits and manufacturing methods thereof; and more particularly, to a test apparatus for integrated circuits which has high sensitivity, high accuracy and long service life, and a manufacturing method thereof.

DESCRIPTION OF RELATED ART

Test apparatuses for integrated circuits are used to test whether the integrated circuits operate properly, and detect which portions of the integrated circuits can't operate correctly. The test apparatuses for integrated circuits generally includes non-contact test apparatuses and contact test apparatuses. The non-contact test apparatuses generally include electron beam test apparatuses, laser plasma test apparatuses and electrical field test apparatuses. Operation cost of such kinds of non-contact test apparatuses is relatively high, thus the non-contact test apparatuses are not used widely.

A typical contact test apparatus generally includes a data processor and a data collector. The data collector is electrically connected with the data processor and includes at least a metal probe. In use, a power supply is provided. An anode of the power supply is electrically connected with an integrated circuit wafer. A cathode of the power supply is connected in series to an amperemeter and the metal probe. During testing, the metal probe engages with an access point of the integrated circuit wafer. If the to-be-tested section of the circuit of the integrated circuit wafer was properly constructed, a loop (i.e. a circuit) would be formed. The loop results in a given electrical current flowing through the amperemeter. Contrarily, if the to-be-tested section of the circuit of the integrated circuit wafer was improperly constructed, an open circuit would be formed. The open circuit results in no electrical current flowing through the amperemeter.

Operation cost of the contact test apparatus is relatively low. However, a size of the metal probe is relatively large. As a result, testing accuracy of the contact test apparatus is relatively low. Furthermore, the metal probe has a relatively small mechanical strength, and therefore is prone to bend when engages with the integrated circuit wafer.

What is needed, therefore, is a test apparatus for integrated circuits which has high sensitivity, high accuracy and long service life.

What is also needed is a method for manufacturing the above-mentioned test apparatus for integrated circuits.

SUMMARY OF INVENTION

In one embodiment, a test apparatus for integrated circuits includes a data collector. The data collector includes a cantilever and at least one probe. The probe is formed at a free end of the cantilever and includes at least one carbon nanotube.

In another embodiment, a method for manufacturing the above-described test apparatus for integrated circuits includes the steps of: (a) forming a substrate at a free end of a cantilever; (b) forming at least one electrically conductive film on the substrate; (c) depositing at least one catalyst film on the corresponding electrically conductive film; and (d) depositing at least one carbon nanotube on each catalyst film thereby forming at least one probe thereat.

Other advantages and novel features of the present test apparatus for integrated circuits and the related manufacturing method will become more apparent from the following detailed description of preferred embodiments when taken in conjunction with the accompanying drawings.

BRIEF DESCRIPTION OF DRAWINGS

Many aspects of the present test apparatus for integrated circuits and the related manufacturing method can be better understood with reference to the following drawings. The components in the drawings are not necessarily to scale, the emphasis instead being placed upon clearly illustrating the principles of the present test apparatus for integrated circuits and the related manufacturing method.

Figure 1:
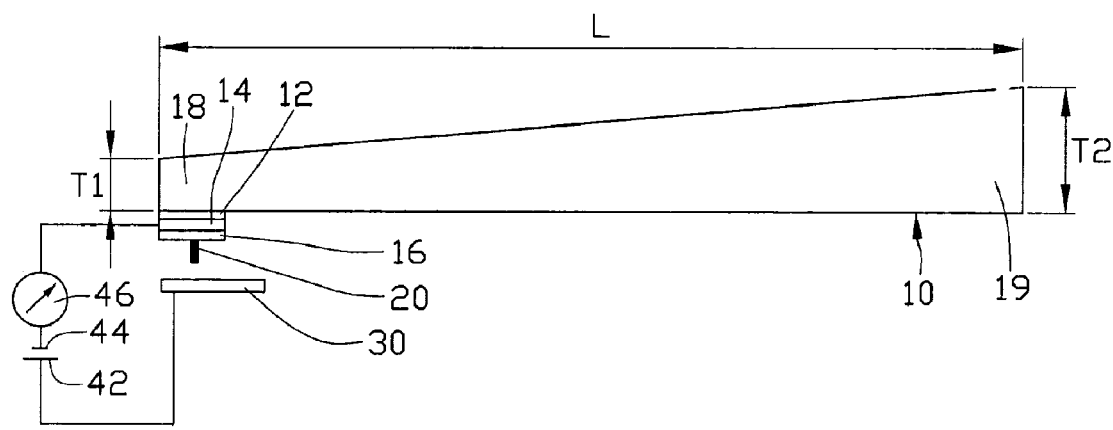
FIG. 1 is a schematic side view of a test apparatus for integrated circuits in accordance with a preferred embodiment of the present device.

Corresponding reference characters indicate corresponding parts throughout the several views. The exemplifications set out herein illustrate at least one preferred embodiment of the present test apparatus for integrated circuits and the related manufacturing method, in one form, and such exemplifications are not to be construed as limiting the scope of the invention in any manner.

DETAILED DESCRIPTION

Reference will now be made to the drawings to describe embodiments of the present test apparatus and the related manufacturing method, in detail.

Referring to FIG. 1, a test apparatus for integrated circuits includes a data collector 1. The data collector 1 includes a cantilever 10 and a probe 20. The cantilever 10 has a free end 18 and an opposite fixed end 19. The probe 20 is formed at the free end 18 of the cantilever 10 and includes a plurality of carbon nanotubes 22 (shown in FIG. 2). A length L of the cantilever 10 is approximately in the range from 1 centimeter to 10 centimeters. A thickness T1 of the free end 18 of the cantilever 10 is approximately in the range from 0.1 millimeters to 0.5 millimeters. A thickness T2 of the fixed end 19 of the cantilever 10 is approximately in the range from 0.2 millimeters to 1 millimeter. A length of the probe 20 is in the approximate range from 0.1 micrometers to 5 micrometers. In the preferred embodiment, the length L of the cantilever 10 is approximately in the range from 2 centimeters to 5 centimeters. The thickness T1 of the free end 18 of the cantilever 10 is approximately in the range from 0.2 millimeters to 0.4 millimeters. The thickness T2 of the fixed end 19 of the cantilever 10 is approximately in the range from 0.4 millimeters to 0.8 millimeters. The length of the probe 20 is in the approximate range from 1 micrometer to 3 micrometers.

Figure 2:
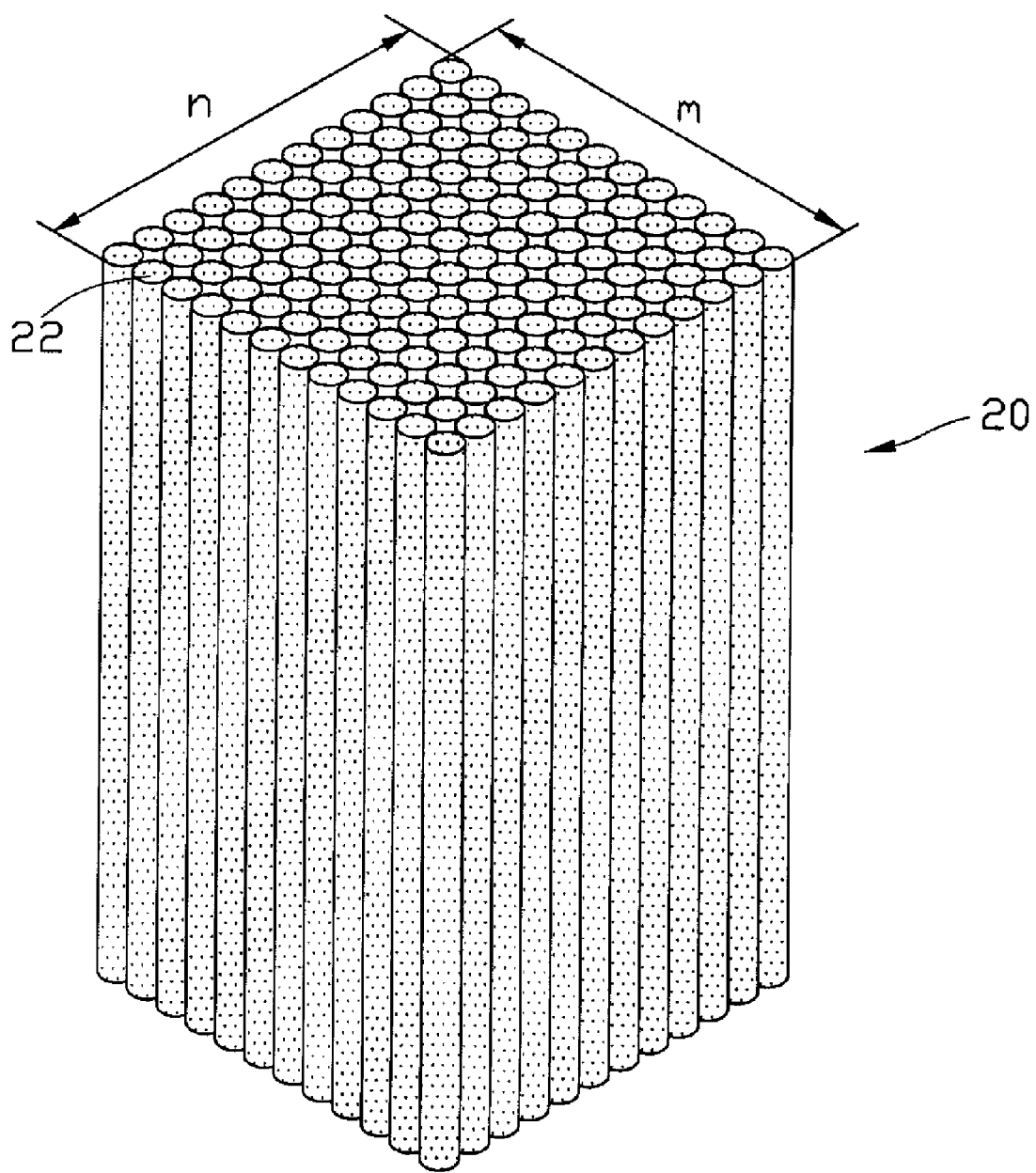
FIG. 2 is an isometric enlarged view of a probe of the test apparatus of FIG. 1.

Referring to FIG. 2, in the preferred embodiment, the probe 20 includes a plurality of carbon nanotubes 22. The carbon nanotubes 22 are arranged in m rows and n columns. The integer m is approximately in the range from 5 to 25, and the integer n is approximately in the range from 5 to 25. In the preferred embodiment, the integer m is approximately in the range from 10 to 20, and the integer n is approximately in the range from 10 to 20. A wall thickness of each carbon nanotube 22 is in the approximate range from 5 nanometers to 50 nanometers. A diameter of each carbon nanotube 22 is in the approximate range from 20 nanometers to 200 nanometers.

A method for manufacturing the test apparatus includes the following steps. Firstly, a substrate 12 is formed at the free end 18 of the cantilever 10. The substrate 12 is made of a material selected from the group consisting of glass, quartz, silicon, and alumina. In the preferred embodiment, the substrate 12 is made of silicon. Secondly, an electrically conductive film 14 is formed on the silicon substrate 12. The electrically conductive film 14 is comprised of a material selected from the group consisting of copper, gold and silver. A thickness of the electrically conductive film 14 is approximately in the range from 50 nanometers to 500 nanometers. Thirdly, a catalyst film 16 is uniformly deposited on the electrically conductive film 14 by means of a chemical vapor deposition process, a thermal disposition process, an electron-beam disposition process, or a sputtering process. The catalyst film 16 is comprised of a material selected from the group consisting of iron (Fe), cobalt (Co), and nickel (Ni). In the preferred embodiment, the catalyst film 16 is made of iron (Fe) and is uniformly deposited on the electrically conductive film 14 by means of the chemical vapor deposition process. A thickness of the catalyst film 16 is approximately in the range from 100 nanometers to 500 nanometers.

Then, the catalyst film 16 is oxidized to obtain catalyst particles (not shown). The free end 18 of the cantilever 10 is placed in a reaction furnace (not shown). A carbon source gas is introduced in the reaction furnace. Under a temperature in the range of 500-900° C., the carbon nanotubes 22 are formed extending from the catalyst film 16. Namely, the probe 20 constructed of the carbon nanotubes 22 is created on the catalyst film 16. The carbon source gas is selected from the group consisting of methane, ethane, acetylene and ethene. A length of the carbon nanotubes 22 can be controlled by controlling the growth time period thereof. In the preferred embodiment, the length of each carbon nanotube 22 is approximately in the range from 1 micrometer to 3 micrometers.

In use, a power supply is provided. An anode 42 of the power supply is electrically connected to an integrated circuit wafer 30. A cathode 44 of the power supply is connected in series to an amperemeter 46 and the electrically conductive film 14. During testing, the probe 20 engages with an access point of the integrated circuit wafer 30. If the to-be-tested section of the circuit of the integrated circuit wafer 30 was properly constructed, a loop (i.e. a circuit) would be formed. The loop results in a given electrical current flowing through the amperemeter 46. Contrarily, if the to-be-tested section of the circuit of the integrated circuit wafer 30 was improperly constructed, an open circuit would be formed. The open circuit results in no electrical current flowing through the amperemeter 46.

Figure 3:
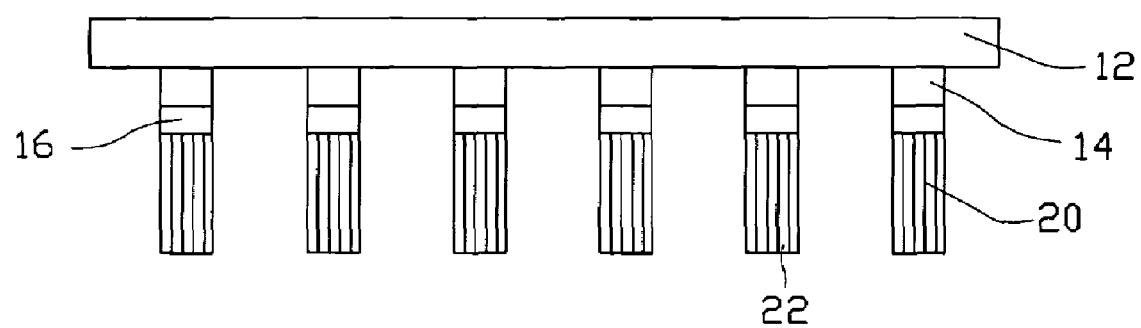
FIG. 3 is a schematic, enlarged view showing a plurality of probes formed on a substrate.

Alternatively, referring to FIG. 3, the data collector 1 has a plurality of probes 20 formed at the free end 18 of the cantilever 10. Each probe 20 includes a plurality of carbon nanotubes 22. A method for forming the probes 20 at the free end 18 of the cantilever 10 includes the following steps. Firstly, a plurality of electrically conductive films 14 is substantially equidistantly formed on the silicon substrate 12. A distance between every two adjacent electrically conductive films 14 is approximately in the range from 10 micrometers to 100 micrometers. In the preferred embodiment, the distance is approximately in the range from 20 micrometers to 50 micrometers. Secondly, a plurality of catalyst films 16 is deposited on the corresponding electrically conductive films 14 by means of the chemical vapor deposition process. A distance between every two adjacent catalyst films 16 is approximately in the range from 10 micrometers to 100 micrometers. In the preferred embodiment, the distance is approximately in the range from 20 micrometers to 50 micrometers.

Then, each catalyst film 16 is oxidized thereby obtaining a plurality of catalyst particles (not shown). After that, the free end 18 of the cantilever 10 is placed in a reaction furnace (not shown). A carbon source gas is introduced in the reaction furnace. Under a temperature in the range of 500-900° C., the carbon nanotubes 22 are fabricated on each catalyst film 16. Namely, the probes 20 constructed of the carbon nanotubes 22 are formed on the corresponding catalyst films 16. A distance between every two adjacent probes 20 is approximately in the range from 10 micrometers to 100 micrometers. In the preferred embodiment, the distance is approximately in the range from 20 micrometers to 50 micrometers.

In use, a plurality of power supplies is provided. An anode of each power supply is electrically connected with one integrated circuit wafer. A cathode of the corresponding power supply is connected in series to one amperemeter and one electrically conductive film 14. During testing, the probes 20 engage with corresponding access points of the integrated circuit wafer. Thus, a plurality of testing circuits is formed. If the to-be-tested sections of the circuit of the integrated circuit wafer was properly constructed, loops (i.e. circuits) would be formed. The loops result in given electrical currents flowing through the amperemeters. Contrarily, if the to-be-tested sections of the circuit of the integrated circuit wafer were improperly constructed, open circuits would be formed. The open circuits result in no electrical currents flowing through the amperemeters. The data collector 1 having the probes 20 can simultaneously test a plurality of access points of the integrated circuit wafer, thereby having high testing efficiency.

Compared with a conventional test apparatus for integrated circuits, the present test apparatus for integrated circuits adopts carbon nanotubes as probes. The carbon nanotubes has small size, good thermal property, and perfectly electrical property, thus the present test apparatus for integrated circuits has high sensitivity and high accuracy. Furthermore, the carbon nanotubes has an excellent mechanical strength, thus would not bend when engages with the integrated circuit wafer. This ensures that the present test apparatus for integrated circuits has long service life.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A test apparatus for integrated circuits comprising a data collector, the data collector comprising:
   a cantilever having a free end;
   a substrate formed at the free end;
   at least one electrically conductive film formed on a surface of the substrate facing away from the free end;
   at least one catalyst film formed on the corresponding electrically conductive film; and
   at least one probe grown from the corresponding catalyst film and each of the at least one probe comprising at least one carbon nanotube.

2. The test apparatus for integrated circuits as claimed in claim 1, wherein a length of the probe is in the approximate range from 0.1 micrometers to 5 micrometers.

3. The test apparatus for integrated circuits as claimed in claim 1, wherein a wall thickness of the carbon nanotube is in the approximate range from 5 nanometers to 50 nanometers.

4. The test apparatus for integrated circuits as claimed in claim 1, wherein a diameter of the carbon nanotube is approximately in the range from 20 nanometers to 200 nanometers.

5. The test apparatus for integrated circuits as claimed in claim 1, wherein the probe comprises a plurality of carbon nanotubes.

6. The test apparatus for integrated circuits as claimed in claim 5, wherein the carbon nanotubes are arranged in m rows and n columns.

7. The test apparatus for integrated circuits as claimed in claim 6, wherein the integer m is approximately in the range from 5 to 25, and the integer n is approximately in the range from 5 to 25.

8. The test apparatus for integrated circuits as claimed in claim 1, wherein the data collector comprises a plurality of the electrically conductive films, each of the electrically conductive film has a corresponding catalyst film formed thereon, and each of the catalyst films has a corresponding probe grown therefrom.

9. The test apparatus for integrated circuits as claimed in claim 8, wherein a distance between every two adjacent probes is approximately in the range from 10 micrometers to 100 micrometers.

10. A method for manufacturing a test apparatus for integrated circuits comprising the steps of:
    (a) forming a substrate at a free end of a cantilever;
    (b) forming at least one electrically conductive film on a surface of the substrate facing away from the free end;
    (c) depositing at least one catalyst film on the corresponding electrically conductive film; and
    (d) depositing at least one carbon nanotube on each catalyst film thereby forming at least one probe thereat.

11. The method for manufacturing a test apparatus for integrated circuits as claimed in claim 10, wherein the electrically conductive film is comprised of a material selected from the group consisting of copper, gold and silver.

12. The method for manufacturing a test apparatus for integrated circuits as claimed in claim 10, wherein a thickness of the electrically conductive film is approximately in the range from 50 nanometers to 500 nanometers.

13. The method for manufacturing a test apparatus for integrated circuits as claimed in claim 10, wherein the catalyst film is comprised of a material selected from the group consisting of iron, cobalt and nickel.

14. The method for manufacturing a test apparatus for integrated circuits as claimed in claim 10, wherein a thickness of the catalyst film is approximately in the range from 100 nanometers to 500 nanometers.

15. The method for manufacturing a test apparatus for integrated circuits as claimed in claim 10, wherein a length of the carbon nanotube is in the approximate range from 0.1 micrometers to 5 micrometers.

16. The method for manufacturing a test apparatus for integrated circuits as claimed in claim 10, wherein the substrate has a plurality of electrically conductive films formed thereon.

17. The method for manufacturing a test apparatus for integrated circuits as claimed in claim 16, wherein a distance between adjacent electrically conductive films is approximately in the range from 10 micrometers to 100 micrometers.

18. The method for manufacturing a test apparatus for integrated circuits as claimed in claim 16, wherein each electrically conductive film has a corresponding catalyst film formed thereon.

19. The method for manufacturing a test apparatus for integrated circuits as claimed in claim 10, wherein the catalyst film has a plurality of carbon nanotubes deposited thereon.

20. The method for manufacturing a test apparatus for integrated circuits as claimed in claim 10, wherein the substrate is comprised of a material selected from the group consisting of glass, quartz, silicon, and alumina.

* * * * *